(12) United States Patent
Oosuge

(10) Patent No.: US 8,316,275 B2
(45) Date of Patent: Nov. 20, 2012

(54) TURBO DECODING SYSTEM, TRANSMISSION POWER CONTROL METHOD AND CDMA MOBILE COMMUNICATION TERMINAL

(75) Inventor: Michihiro Oosuge, Tokyo (JP)

(73) Assignee: NEC Corporation, Tokyo (JP)

( * ) Notice: Subject to any disclaimer, the term of this patent is extended or adjusted under 35 U.S.C. 154(b) by 1098 days.

(21) Appl. No.: 11/993,916

(22) PCT Filed: Jun. 29, 2006

(86) PCT No.: PCT/JP2006/312959
§ 371 (c)(1),
(2), (4) Date: Dec. 26, 2007

(87) PCT Pub. No.: WO2007/010722
PCT Pub. Date: Jan. 25, 2007

(65) Prior Publication Data
US 2009/0031190 A1 Jan. 29, 2009

(30) Foreign Application Priority Data
Jul. 19, 2005 (JP) .................................. 2005-209168

(51) Int. Cl.
H03M 13/00 (2006.01)
H03M 13/03 (2006.01)
H04L 27/06 (2006.01)
H04B 7/216 (2006.01)

(52) U.S. Cl. ........ 714/758; 714/752; 714/786; 375/340; 375/341; 370/342

(58) Field of Classification Search .................. 714/758, 714/752, 786; 375/340, 341; 370/342
See application file for complete search history.

(56) References Cited

U.S. PATENT DOCUMENTS
5,982,766 A * 11/1999 Nystrom et al. .............. 370/347
(Continued)

FOREIGN PATENT DOCUMENTS
JP 2001156711 A 6/2001
(Continued)

OTHER PUBLICATIONS

Kawai et al., Outer-loop control of target SIR for fast transmit power control in turbo-coded W-CDMA mobile radio, Electronics Letters, Apr. 29, 1999 vol. 35 No. 9. pp. 699-701.*

(Continued)

*Primary Examiner* — John J Tabone, Jr.

(57) ABSTRACT

There are provided a turbo decoding system of a CDMA mobile communication terminal, a transmission power control method, and a CDMA mobile communication terminal in which interference in the other users is suppressed by not increasing the transmission power of a base station to a value over the necessary value and excessive repetitive processing is prevented in the turbo decoding section to reduce consumption power.
There are disposed a BLER measuring section 10 to measure BLER as reception quality for each number of decoding bits on the basis of a CRC judge result after an error correction by the turbo decoding section 4 and an outer loop power control and iteration control section 11 to control transmission power of a base station and to control the iteration count of turbo decoding on the basis of the reception quality of each number of decoding bits. The outer loop power control and iteration control section 11 controls the transmission power of the base station by producing a target SIR according to the reception signal such that SIR of the reception signal is the target SIR and adaptively controls to make the iteration count optimal on the basis of the convergence state of the outer loop transmission power control.

18 Claims, 7 Drawing Sheets

U.S. PATENT DOCUMENTS

| | | | | |
|---|---|---|---|---|
| 6,415,137 | B1* | 7/2002 | Hayashi | 455/70 |
| 6,597,923 | B1* | 7/2003 | Vanghi et al. | 455/522 |
| 6,771,978 | B1* | 8/2004 | Kayama et al. | 455/522 |
| 6,988,233 | B2* | 1/2006 | Kanai et al. | 714/755 |
| 7,336,733 | B2* | 2/2008 | Naito | 375/340 |
| 7,340,013 | B2* | 3/2008 | Ammer et al. | 375/340 |
| 7,421,033 | B2* | 9/2008 | Hottinen | 375/264 |
| 7,817,972 | B2* | 10/2010 | Wan et al. | 455/115.1 |
| 7,966,505 | B2* | 6/2011 | Gao et al. | 713/320 |
| 2002/0012383 | A1* | 1/2002 | Higuchi et al. | 375/141 |
| 2002/0049948 | A1* | 4/2002 | Lee et al. | 714/755 |
| 2002/0049952 | A1* | 4/2002 | Lee et al. | 714/786 |
| 2002/0058524 | A1* | 5/2002 | Arimitsu | 455/522 |
| 2008/0019468 | A1* | 1/2008 | Ammer et al. | 375/350 |

FOREIGN PATENT DOCUMENTS

| | | |
|---|---|---|
| JP | 2001186024 A | 7/2001 |
| JP | EP 1168657 A2 * | 1/2002 |
| JP | 2002171175 A | 6/2002 |
| JP | 2004304620 A | 10/2004 |

OTHER PUBLICATIONS

Japanese Office Action for JP2007-525924 issued May 31, 2011.
PCT/JP2006/312959 International Search Report, mailed Sep. 12, 2006.
Supplementary European Search Report for EP 06 76 7576 completed Nov. 29, 2011.

* cited by examiner

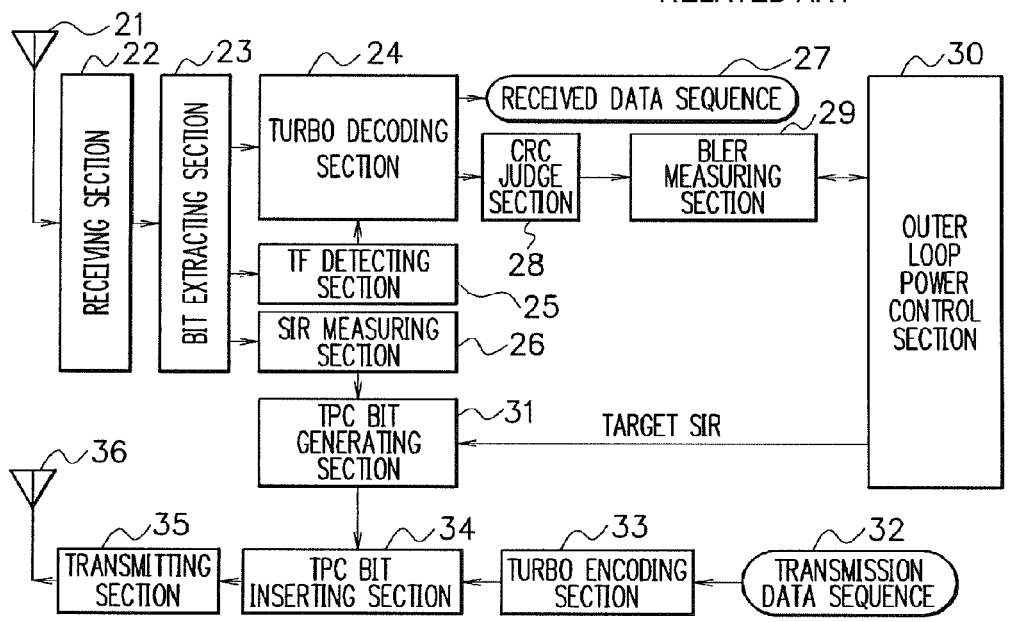
FIG. 1 -- RELATED ART --
FIG. 2 -- RELATED ART --
| TFCI (TRANSPORT FORMAT COMBINATION INDICATOR) | EXAMPLE OF NUMBER OF BITS BEFORE TURBO ENCODING (TRANSPORT FORMAT) |
|---|---|
| 0 | 0BITS + CRC 16BITS |
| 1 | 100BITS + CRC 16BITS |
| 2 | 200BITS + CRC 16BITS |
| 3 | 300BITS + CRC 16BITS |

TURBO DECODING SYSTEM, TRANSMISSION POWER CONTROL METHOD AND CDMA MOBILE COMMUNICATION TERMINAL

TECHNICAL FIELD

The present invention pertains to a Code Division Multiple Access (CDMA) mobile communication, and in particular, to a turbo decoding system for a CDMA mobile communication terminal controlling transmission power of a base station, a transmission power control method for the same, and a CDMA mobile communication terminal.

RELATED ART

FIG. 1 is a diagram showing a turbo decoding system for a CDMA mobile communication terminal and a transmission power control method of the related art. Next, the related art will be described by referring to FIG. 1.

The primary configuration and functions of the turbo decoding system of the conventional example are as follows.

That is, the system includes a receiving antenna 21, a receiving section 22, a bit extracting section 23, a turbo decoding section 24, and a TF detecting section 25; and data sent from a base station is received by the receiving antenna 21 and A/D converted, de-spread, and demodulated by the receiving section 22. Digitally converted, demodulated data are divided by the bit extracting section 23 into turbo decoding input data, a Transport Format Combination Indicator (TFCI) bit and a pilot bit, and then respectively inputted to the turbo decoding section 24, the TF detecting section 25, and an SIR measuring section 26. The detecting section 25 calculates, according to the TFCI bit inputted thereto, a data format including the number of bits to be fed to the decoding section 24. User data 27 of which errors are corrected by the turbo decoding section 24 is used by, for example, an upper-class application of a terminal.

FIG. 2 is an image diagram showing a relationship between TFCI and the number of bits before turbo decoding. At communication, a table similar to that of FIG. 2 is notified from the base station, and the conversion from the TFCI into the TF is carried out by the TF detecting section 25 on the basis of the table.

On the other hand, the transmission side includes a turbo encoding section 33, a Transmission Power Control (TPC) bit inserting section 34, a transmitting section 35, and a transmitting antenna 36. User data 32 to be transmitted are encoded by the encoder 33, and transmission power control bit is inserted in the data by the TPC bit inserter 34 and the data are then delivered via the transmitting section 35 and the transmission antenna 36 to the base station.

Additionally, the primary configuration and functions of the transmission power control system of the CDMA mobile terminal of the conventional example are as follows.

That is, inner loop power control is accomplished by an Signal to Interference Ratio (SIR) measuring section 26 to measure the SIR, a TPC bit generating section 31 to notify up and down of transmission power of the base station on the basis of an SIR value measured by the SIR measuring section 26 and a target SIR value, and an outer loop power control section 30 to produce the target SIR value. For this purpose, there are further included a CRC judge section 28 which conducts a CRC operation for a decoded result from the turbo decoding section 24 to determine whether or not the decoded data include an error and a Block Error Rate (BLER) measuring section 29 to measure a BLER by counting a result of the CRC operation. The outer loop power controller 30 updates, to set the result of the BLER measurement to an approximate preset value (required quality), the target SIR value to be used by the TPC bit generator 31.

In the configuration above, to set the reception quality on the CDMA mobile communication terminal to a fixed value in any situation, the base station side can control the transmission power to the CDMA mobile communication terminal based on the received TPC bit.

Also, the turbo decoder 24 is capable of improving the error correction performance by repeatedly conducting the decoding operation as indicated by "iteration count". Therefore, in the CDMA mobile communication terminal, the turbo encoding section (encoder) is beforehand configured to operate according to the iteration count set to attain the error correction performance not less than the predetermined value.

Furthermore, there has been known an optimizing method, for the iteration count of the decoding operation in the turbo decoder for received signals from a plurality of users at a wireless base station, of improving the reception characteristic through a small amount of operations (reference is to be made to patent article 1).

Patent article 1: Japanese Patent Laid-Open Pub. No. 2004-304620

DISCLOSURE OF THE INVENTION

Problem to be Solved by the Invention

However, the turbo decoding system and the transmission power control method of the related art are attended with the following problems.

The first problem resides in a point that although the performance increases when the iteration count of the turbo decoder becomes greater, the amount of processing increases and consumed power becomes greater.

In conjunction with this point, there has been known a method of optimizing the iteration count of the turbo decoder by measuring the reception quality of received signals of the base station as described in patent article 1. However, if the iteration count of the turbo decoder is controlled according to only the reception quality in a mobile communication terminal of a CDMA mobile communication system conducting the transmission power control as described above, the transmission power of the base station becomes greater to increase interference power to other users depending on a convergence state of the transmission power control. Consequently, it is not possible to simply reduce the repetitious processing even in an environment in which reception power is temporarily high.

The second problem resides in a point in which although reception data are inputted to the turbo decoding system of the mobile communication terminal at an interval of a period of unit time for a decoding operation thereof, the number of bits inputted thereto is not always fixed, but there may exist a plurality of bit sizes (number of bits) as shown in FIG. 2. If the number of bits varies between the processing units, the reception characteristic of the mobile communication terminal changes, and hence it is required that the outer loop power control to maintain the quality is carried out in consideration of the characteristic difference. However, if the transmission power control is conducted in association with the number of bits requiring the highest reception performance (in a case in which the number of bits takes a maximum value in general), the reception quality is excessive for the other bit sizes, which wastes consumption current.

It is therefore an exemplary object of the present invention, which has been devised to solve the problems above, to provide a turbo decoding system for a CDMA mobile communication terminal, a transmission power control method, and a CDMA mobile communication terminal in which the consumption current of the turbo decoding section can be reduced without increasing the transmission power on the base station side to a value over the required value.

Another exemplary object of the present invention is to provide a turbo decoding system for a CDMA mobile communication terminal, a transmission power control method, and a CDMA mobile communication terminal in which excessive repetitious processing is prevented in the operation of the turbo decoding to reduce the consumption current.

Another exemplary object of the present invention is to provide a turbo decoding system for a CDMA mobile communication terminal, a transmission power control method, and a CDMA mobile communication terminal in which the outer loop power control and the control of the iteration count of the turbo decoding are appropriately carried out.

Another exemplary object of the present invention is to provide a turbo decoding system for a CDMA mobile communication terminal, a transmission power control method, and a CDMA mobile communication terminal in which the iteration count is adaptively controlled on the basis of the convergence state of the outer loop power control so that the increase in the interference power to the other users can be controlled.

Means for Solving the Problem

To solve the problems, there are provided in accordance with the present invention a CDMA mobile communication terminal and a turbo decoding system thereof to control transmission power of a base station on the basis of reception quality of a reception signal measured according to a CRC judge result after an error correction by turbo decoding, characterized by comprising a quality measuring unit (e.g., a BLER measuring section 10 of FIG. 3) which measures the reception quality for each number of decoding bits and a control section (e.g., an outer loop power control and iteration control section 11) which controls for each number of decoding bits, on the basis of the reception quality of each decoding bit count measured by the quality measuring unit, a transmission power control bit (TPC bit) to control transmission power of a base station and to be inserted in a transmission signal, and an iteration count of turbo decoding; and the control section is characterized in that the control section controls to make the iteration count of turbo decoding optimal if the reception quality of the number of decoding bits requiring highest reception performance satisfies predetermined reception quality due to control of the transmission power control bit on the basis of the reception quality of the number of decoding bits requiring highest reception performance, and controls, if the reception quality of the number of decoding bits requiring highest reception performance does not satisfy predetermined reception quality, the transmission power control bit on the basis of the reception quality of the number of decoding bits other than the number of decoding bits described above.

Also, the control section is characterized in that the control section controls, if the reception quality of the number of decoding bits requiring highest reception performance has been updated within a predetermined period of time in the past and satisfies predetermined reception quality, the iteration count of turbo decoding. Moreover, the control section is characterized in that the control section controls, if the reception quality of the number of decoding bits requiring highest reception performance has not been updated within a predetermined period of time in the past, the transmission power control bit on the basis of the reception quality of the number of decoding bits other than the number of decoding bits described above, and once returns, if the reception quality of the number of decoding bits requiring highest reception performance has been updated neither within a predetermined period of time in the past nor within a fixed period of time before the predetermined period of time in the past, the iteration count of turbo decoding for the number of decoding bits other than the number of decoding bits described above to a maximum value.

In addition, the control section is characterized in that the control section conducts, as control of the iteration count, control of the iteration count of turbo decoding such that the reception quality of the number of decoding bits other than the number of decoding bits requiring highest reception performance satisfies required quality.

More concretely, there are included an SIR measuring section that measures a signal-to-interference ratio using a reception signal, a TPC bit generating section that generates a transmission power control bit such that an output from the SIR measuring section is a target signal-to-interference ratio, and a TPC bit inserting section that inserts the transmission power control bit in a transmission signal, wherein the control section outputs the target signal-to-interference ratio to the TPC bit generating section on the basis of a block error rate measured as reception quality for each number of decoding bits by the quality measuring section such that the block error rate when the number of decoding bits as the number of decoding bits requiring highest reception performance takes a maximum value satisfies the target signal-to-interference ratio in mobile communication; and controls for each number of decoding bits, if the block error rate when the number of decoding bits is a maximum value has been converged to required quality, the iteration count of turbo decoding such that each block error rate of each number of decoding bits other than that when the number of decoding bits is a maximum value satisfies required quality.

Additionally, there is provided in accordance with the present invention, as a transmission power control method, a transmission power control method of a CDMA mobile communication terminal to control transmission power of a base station on the basis of reception quality of a reception signal measured according to a CRC judge result after an error correction by turbo decoding, characterized by comprising measuring the reception quality for each number of decoding bits and controlling for each number of decoding bits, on the basis of measured reception quality of each decoding bit count, a transmission power control bit to control transmission power of a base station and to be inserted in a transmission signal, and an iteration count of turbo decoding. The method is characterized by controlling to make the iteration count of turbo decoding optimal if the reception quality of the number of decoding bits requiring highest reception performance satisfies predetermined reception quality due to control of the transmission power control bit on the basis of the reception quality of the number of decoding bits requiring highest reception performance, and controlling, if the reception quality of the number of decoding bits requiring highest reception performance does not satisfy predetermined reception quality, the transmission power control bit on the basis of the reception quality of the number of decoding bits other than the number of decoding bits described above.

Also, the method is characterized by controlling, if the reception quality of the number of decoding bits requiring highest reception performance has been updated within a predetermined period of time in the past and satisfies predetermined reception quality, the iteration count of turbo decoding, and controlling, if the reception quality of the number of decoding bits requiring highest reception performance has not been updated within a predetermined period of time in the past, the transmission power control bit on the basis of the reception quality of the number of decoding bits other than the number of decoding bits described above. In addition, the method is characterized by once setting, if the reception quality of the number of decoding bits requiring highest reception performance has been updated neither within a predetermined period of time in the past nor within a fixed period of time before the predetermined period of time in the past, the iteration count of turbo decoding for the number of decoding bits other than the number of decoding bits described above to a maximum value. Moreover, the method is characterized by conducting, as control of the iteration count, control of the iteration count of turbo decoding such that the reception quality of the number of decoding bits other than the number of decoding bits requiring highest reception performance satisfies required quality.

More specifically, the method is characterized by measuring a signal-to-interference ratio using a reception signal, generating a transmission power control bit such that the measured signal-to-interference ratio is a target signal-to-interference ratio, inserting the transmission power control bit in a transmission signal, and producing the target signal-to-interference ratio on the basis of a block error rate measured as reception quality for each number of decoding bits such that the block error rate when the number of decoding bits as the number of decoding bits requiring highest reception performance takes a maximum value satisfies the target signal-to-interference ratio in mobile communication.

The turbo decoding system, the transmission power control method, and the CDMA mobile communication terminal of the present invention are characterized in that by adaptively controlling the iteration count on the basis of the convergence state of the outer loop transmission power control, the excessive repetitious processing is prevented to reduce the consumption current. On the basis of the reception quality of the number of bits requiring highest reception performance, the outer loop power control and iteration control section 11 carries out the transmission power control on the base station side. As a result, if predetermined reception quality is satisfied, control is further accomplished to optimize the iteration count of the turbo decoder 4. Therefore, the consumption current of the turbo decoder can be reduced without increasing the transmission power on the base station side to a value more than the required value. That is, the outer loop power control and iteration control section 11 feeds a target SIR to the TPC bit generator 12 such that a Block Error Rate (BLER) of the number of turbo decoding bits measured by A of the BLER measuring section 10 at its maximum satisfies required quality in the mobile communication. If BLER A of the number of turbo decoding bits at the maximum has converged onto the predetermined quality, the control section 11 supervises the iteration count of the turbo decoder 4 for each of the numbers of decoding bits such that all of BLER of the numbers of other turbo decoding bits satisfies the required quality. In this fashion, since the difference in the reception characteristic between the numbers of turbo decoding bits is adjusted by altering the iteration count, it is possible to stabilize the reception characteristic and to reduce the amount of consumption current at the same time (FIG. 3).

Advantages of the Invention

In accordance with the present invention, there are obtained advantages described below.

The first advantage resides in that since the reception quality (block error rate) is separately measured for each number of bits to conduct the turbo decoding, the required reception quality can be satisfied for each number of decoding bits, and it is hence possible to realize stable reception performance.

The second advantage is that since the iteration count at turbo decoding can be controlled for each number of bits to conduct the turbo decoding in the configuration, the unnecessary iteration value can be lowered and the amount of processing and the consumption current can be reduced.

The third advantage resides in that since the maximum iteration count is set for the number of turbo decoding bits for which the highest reception performance is required, the transmission power of the base station is not increased more than necessary and it is possible to prevent increase in the interference in other users.

The fourth advantage is that if the reference number reliability of measured reception quality for the number of turbo decoding bits required the highest reception performance is low, the iteration control is not conducted according to the configuration, and hence it is possible to prevent deterioration in the performance due to an erroneous operation in the iteration control processing.

Best Mode for Carrying out the Invention

Description will now be given in detail of embodiments of a turbo decoding system for a CDMA mobile communication terminal, a transmission power control method, and a CDMA mobile communication terminal in accordance with the present invention.

(Description of Configuration)

FIG. 3 is a block diagram showing a configuration of a CDMA mobile communication terminal as an exemplary embodiment of the present invention. The CDMA mobile communication terminal includes, a receiving antenna section 1, a receiving section 2, a bit extracting section 3, a turbo decoding section 4, a Transport Format (TF) detecting section 5, a Signal-to-Interference Ratio (SIR) measuring section 6 to measure SIR, a CRC judge section 8, a selector 9, a Block Error Rate (BLER) measuring section (A, B1, B2, B3, . . . ) 10 to measure a block error rate for each transport format, an outer loop power control and iteration control section 11, a TPC bit generating section 12 to generate a Transmission Power Control (TPC) bit, a turbo encoding section 14, a TPC bit inserting section 15 to insert the transmission power control bit to a transmission signal, a transmitting section 16, and a transmitting antenna section 17.

The main configuration and functions of a turbo decoding system of a CDMA mobile communication terminal in the exemplary embodiment are as follows.

That is, the system includes the receiving antenna 1, the receiving section 2, the bit extracting section 3, the turbo decoding section 4, the TF detecting section 5; and data sent from a base station are received by the receiving antenna 1, A/D converted, de-spread, and demodulated by the receiving section 2. Digitally converted, demodulated data are divided by the bit extracting section 3 into turbo decoding input data, a Transport Format Combination Indicator (TFCI) bit, and a pilot bit to be respectively fed to the turbo decoding section 4, the TF detecting section 5, and the SIR measuring section 6. The TF detecting section 5 calculates, using the inputted TFCI bit, a data format (TF) including such as the number of bits to be inputted to the turbo decoding section 4. User data 7 for which an error correction is conducted by the turbo decoder 4 are used by an upper-class application or the like of the terminal.

Incidentally, the conversion from the TFCI into the TF in the TF detecting section 5 is carried out on the basis of a table like that of FIG. 2 notified from the base station at communication. That is, since table information which is like that shown and which indicates a relationship between the TFCI and the number of bits before turbo decoding is notified at communication with the base station, the CDMA mobile communication terminal converts the TFCI bits fed from the bit extracting section 3, into the TF such as the number of bits before turbo decoding, and the converted TF is used by the turbo decoding section 24 to conduct the decoding for each number of turbo decoding bits.

On the other hand, the transmission side includes a turbo encoding section 14, a TPC bit inserting section 15, a transmitting section 16, and a transmitting antenna 17. The turbo encoding section 14 encodes user data 13 to be transmitted from the CDMA mobile communication terminal, and transmission power control (TPC) bit is inserted in the data by the TPC bit inserting section 15. Then the data are then delivered via the transmitting section 16 and the transmission antenna 17 to the base station.

Additionally, the primary configuration and functions of the transmission power control system and the error correction system based on turbo decoding for the CDMA mobile terminal of the present embodiment are as follows.

That is, the configuration includes an SIR measuring section 6, a TPC bit generating section 12, a TF detecting section 5, a CRC judge section 8, a selector 9, a BLER measuring section (A, B1, B2, B3, ...) 10, and an outer loop power control and iteration control section 11. For the functions of the transmission power control system, there is included the TPC bit generating section 12 which generates a TPC bit to notify up or down of the transmission power of the base station on the basis of the SIR value measured by the SIR measuring section 6 and the target SIR value, and hence it is possible to control inner loop transmission power. In addition, there are included the CRC judge section 8 which conducts a CRC operation for the decoded result of the turbo decoding section 4 to determine whether or not the decoded data include an error, and the BLER measuring section (A, B1, B2, B3, ...) 10 which counts a fixed number of times the CRC judge result via the selector 9 for each TF detected by the TF detecting section 5 to thereby measure the Block Error Rate (BLER). The outer loop power control and iteration control section 11 updates the target SIR value to be used by the TPC bit generator 12 such that each BLER measured for each TF is equal to or more than a preset value (required quality).

Moreover, as a function of the error correction system based on turbo decoding, in concurrence with the update of the target SIR value, the optimal iteration count for each TF to be turbo-decoded is notified to the turbo decoding section 4 such that the BLER value is not excessive quality more than the required quality. The turbo decoding section 4 conducts the turbo decoding on the basis of bit count information from the TF detecting section 5 and the iteration specification from the outer loop power control and iteration control section 11.

According to the configuration, since the iteration count is optimized to a required iteration count for each TF at turbo decoding, the unnecessary processing can be suppressed and the consumption power is reduced in the mobile communication terminal.

In this connection, the turbo decoding section 4 and the turbo encoding section 14 of FIG. 3 have been well known as an error correction method in a mobile communication system to those skilled in the art, and hence the detailed configuration thereof will be avoided.

Also, in general, to improve error correction performance, there is simultaneously employed a method of dispersing error occurrence locations by interleave or the like, but the method is not directly related to the present invention and is hence not shown in FIG. 3.

Additionally, in the above description, since the pilot bit, the TPC bit, and TFCI bit to detect TF are prescribed by the standardization specification of 3rd Generation Partnership Project (3GPP) and the like, detailed description thereof will be avoided.

(Description of Operation)

Description will now be given in detail of the general operation of the transmission power control and the error correction system in the exemplary embodiment by referring to FIG. 3 and a flowchart.

FIG. 4 is a diagram showing a flowchart of the general operation of the exemplary embodiment.

When the mobile communication terminal starts communication, the outer loop power control and iteration control section 11 conducts initialization by setting the maximum value of the iteration count of each TF (TF A, TF B1, TF B2, TF B3, ...) to the turbo decoding section 4. However, the controller 11 selects, for TF A, a TF (data format) having a larger number of bits than the other TF Bi (i=1, 2, 3, 4, ...; step 1-1). That is, in general, the item having the largest number of bits requires the highest reception performance, and a TF having the pertinent number of bits is set to TF A. Next, the controller 11 sets an initial value of the target SIR beforehand recorded in the mobile communication terminal to the TPC bit generator 12 (step 1-2).

With the setting described above, operations of the transmission power control and the error correction system are started, the data (turbo decoding input data) to be turbo-decoded, the TFCI bit, and the pilot bit are delivered at an interval of a fixed period of time from the bit extracting section 3 respectively to the turbo decoding section 4, the TF detecting section 5, and the SIR measuring section 6. The TF detector 5 calculates the number of bits of the turbo decoding data using the TFCI bit to output the number of bits to the turbo decoder 4 and the selector 9. In this regard, the TFCI bit is prescribed by 3GPP, and the method of calculating the number of bits has been well known to those skilled in the art, and hence description thereof will be here avoided.

The SIR measuring section 6 measures an SIR by use of the pilot bit inputted thereto to deliver the bit to the TPC bit generating section 12, which generates the TPC bit according to the input SIR and the target SIR to send the bit to the base station, to thereby conduct the inner loop transmission power control. Concretely, if the measured SIR is lower than the target SIR, the TPC bit is notified to the base station to increase the transmission power. If the measured SIR is higher than the target SIR, the TPC bit is notified to the base station to decrease the transmission power.

In concurrence with the operation above, the turbo decoding section 4 conducts turbo decoding for data on the basis of the number of bits inputted thereto and the iteration count set as above, and the CRC judge section 8 carries out a CRC operation for the turbo-decoded data to output a judge result indicating whether or not the data include an error (CRC judge result, OK (normal), NG (error), etc.) On the basis of the number of bits calculated by the TF detecting section 5, the selector 9 inputs a signal to the Block Error Rate (BLER) measuring section (A, B1, B2, B3, ...) 10 which respectively measure the BLER using the CRC judge result for each of TF A, TF b1, TF B2, TF B3, ....

The BLER measuring section (A, B1, B2, B3, ...) 10 counts the numbers of OK/NG of the CRC judge results to respectively measure BLER according to expression (1) as below (step 1-3):

$$BLER(X) = \text{Number of } CRC\text{-}NG \text{ of } TF(X)/(\text{Number of } CRC\text{-}NG + \text{number of } CRC\text{-}OK \text{ of } TF(X)), \quad (1)$$

wherein X is TF A or TF Bi (i=1, 2, 3, 4, ...).

In the operation above, the outer loop power control and iteration control section 11 makes a check, for the first TF A, to determine whether or not the denominator of expression (1) described above is equal to or more than a preset fixed value (step 1-4).

If the denominator is equal to or more than the fixed value, the system executes transmission power control processing (the flowchart of FIG. 5) for TF A (step 1-5), which will be described later.

If the denominator is less than the fixed value, the system sets i=1 and then makes a check, by setting TF Bi (i=1; step 1-6) as a processing object, to determine whether or not the denominator of expression (1) above is equal to or more than a preset fixed value (step 1-7).

If the denominator is equal to or more than the fixed value, the system executes transmission power control and iteration control processing (flowcharts of FIGS. 6 and 7) for TF Bi, which will be described later.

If the denominator is less than the fixed value, the system sets i=i+1 and then makes a check, by setting next TF Bi (i=1; step 1-9) as a processing object, to determine whether or not i>Number of TF−1 (step 1-10).

In the case of other than i>Number of TF−1, it is determined that there remains TF Bi to be processed and control returns to step 1-7 for the transmission power control and iteration control processing (flowcharts of FIGS. 6 and 7) for TF Bi to be processed.

Thereafter, if it is determined in step 1-10 that the processing is finished for all TF (i>Number of TF−1), a check is made to determine whether or not the communication is terminated (step 1-11). If the communication is in operation, control returns to step 1-3 to repeatedly conduct the above operation at each time when the input data to be turbo-decoded and the TFCI bit are outputted from the bit extracting section 3 described above. If the termination of communication is finally detected in step 1-11, the overall operation is terminated.

Next, description will be given in detail of the transmission power control processing for TF A shown in FIG. 4 described above.

FIG. 5 is a diagram showing a flowchart of the transmission power control processing for TF A in step 1-5 described above.

If the quality of TF A is more excessive than the required quality, that is, if BLER of TF A is less than BLER beforehand set as the required quality (step 2-1), a value obtained by lowering the target SIR by XdB is set to the TPC bit generating section 12 (step 2-2). By performing the setting, the transmission power of the base station lowers by XdB due to the inner loop transmission power control described above, and hence the excessive quality can be reduced. Thereafter, the value of TF A counted as above (expression (1)) is reset (namely, the CRC OK/NG count value is reset to zero), and then measurement of BLER in the subsequent period is started (step 2-4).

Furthermore, if the quality of TF A is less than the required quality in step 2-1, that is, if BLER of TF A is equal to or more than BLER beforehand set as the required quality, a value obtained by increasing the target SIR by XdB is set to the TPC bit generating section 12 (step 2-3). By conducting the setting, the transmission power of the base station increases by XdB due to the inner loop transmission power control described above, and hence the insufficient quality can be raised. Thereafter, the value of TF A counted as above (expression (1)) is reset (namely, the CRC OK/NG count value is reset to zero), and then measurement of BLER in the subsequent period is started (step 2-4).

Incidentally, the XdB is a value beforehand set to the mobile communication terminal. Also, for the exemplary embodiment, a method of simply comparing the reception quality with the required quality has been described for simplification. However, to prevent fluctuation due to measuring errors and environmental changes, there may be employed a method of conducting control to keep the target SIR unchanged if the difference between the reception quality and the required quality is equal to or less than a preset value.

Subsequently, description will be given in detail of the transmission power control and iteration power control processing for TF Bi in step 1-8 shown in FIG. 4 described above.

FIG. 6 is a diagram showing a flowchart of the transmission power control and iteration power control processing for TF Bi in step 1-8 described above.

The outer loop power control and iteration control section 11 makes a check, according to the measurement result of the BLER measuring section A, to determine whether or not the quality of TF A is equivalent to the required quality (step 3-1). Specifically, if a condition of expression (2) is satisfied as below, it is determined that the quality of TF A is equivalent to the required quality:

$$|BLER \text{ of } TFA - BLER \text{ beforehand set as required quality}| < \alpha \quad (2)$$

wherein $\alpha$ is a fixed value set to the mobile communication terminal in advance.

If it is determined in step 3-1 that the quality of TF A is equivalent to the required quality, namely, the outer loop power control for TF A has converged, the system executes iteration control processing (a flowchart of FIG. 7), which will be described later (step 3-5). Thereafter, the value of TF Bi counted as above (expression (1)) is reset (that is, the CRC–OK/NG count value is set to zero) and the BLER measurement is started for the subsequent period (step 3-6).

If it is determined in step 3-1 that the quality of TF A is not equivalent to the required quality, namely, the outer loop power control for TF A has not converged, a check is made to determine whether or not the quality of TF Bi is more than the required quality, that is, whether or not BLER of TF Bi is less than BLER beforehand set as the required quality (step 3-2).

If it is determined in step 3-2 that the quality of TF Bi is more excessive than the required quality, that is, the BLER of TF Bi is less than the BLER beforehand set as the required quality, a value obtained by decreasing the target SIR by XdB is set to the TPC bit generating section 12 (step 3-3). When the setting is carried out, the transmission power of the base station lowers by XdB due to the inner loop transmission power control described above, and hence the excessive quality can be reduced. Thereafter, the value of TF Bi counted as above (expression (1)) is reset (that is, the CRC–OK/NG count value is set to zero) and the BLER measurement of the subsequent period is started (step 3-6).

If it is determined in step 3-2 that the quality of TF Bi is below the required quality, that is, the BLER of TF Bi is equal to or more than the BLER beforehand set as the required quality, a value obtained by increasing the target SIR by XdB is set to the TPC bit generating section 12 (step 3-4). When the setting is carried out, the transmission power of the base station increases by XdB due to the inner loop transmission power control described above, and hence the insufficient quality can be raised. Thereafter, the value of TF Bi counted as above (expression (1)) is reset (that is, the CRC–OK/NG count value is set to zero) and the BLER measurement is started for the subsequent period (step 3-6).

As in FIG. 5, the XdB is a value beforehand set to the mobile communication terminal. Also, for the exemplary embodiment, a method of simply comparing the reception quality with the required quality has been described for simplification. To prevent fluctuation due to measuring errors and environmental changes, there may be employed a method of conducting control to keep the target SIR unchanged if the difference between the reception quality and the required quality is equal to or less than a preset value. There may also be adopted a method of not conducting up and down of the target SIR if the comparison judge (step 2-1, step 3-2) between the quality of TF A and Bi (i=1, 2, 3, . . . ) and the required quality indicates that both are equal to each other.

Next, description will be given in detail of the iteration control processing in step 3-5 shown in FIG. 6.

FIG. 7 is a diagram showing a flowchart of the iteration control processing in step 3-5.

The outer loop power control and iteration control section 11 makes a check, according to the measurement result of the BLER measuring section Bi, to determine whether or not the quality of TF Bi is more than the required quality (step 4-1).

If the quality of TF Bi is more excessive than the required quality, that is, if BLER of TF Bi is less than BLER beforehand set as the required quality in step 4-1, a check is made to determine whether or not the iteration count of TF Bi is the minimum value (step 4-2).

If the iteration count of TF Bi is other than the minimum value in step 4-2, the iteration count of TF Bi set to the turbo decoding section 4 is decremented by one to terminate the processing (step 4-3), and control goes to (step 3-6) of FIG. 6. Moreover, if the iteration count of TF Bi is the minimum value in step 4-2, the processing is terminated and control goes to (step 3-6) of FIG. 6.

If the quality of TF Bi is equal to or less than the required value, namely, BLER of TF Bi is equal to or more than BLER beforehand set as the required quality in step 4-1, a check is made to determine whether or not the iteration count of TF Bi set in the turbo decoding section 4 is the maximum value (step 4-4).

If the iteration count of TF Bi is other than the maximum value in step 4-4, the iteration count of TF Bi set in the turbo decoding section 4 is incremented by one to terminate the processing (step 4-5), and control goes to (step 3-6) of FIG. 6. Furthermore, if the iteration count of TF Bi is the maximum value in step 4-4, the processing is terminated and control goes to (step 3-6) of FIG. 6.

Through the above operation, the quality of TF A, TF Bi (i=1, 2, 3, 4, . . . ) can be satisfied by the outer loop power control and the unnecessary iteration count at turbo decoding can be reduced at the same time. Additionally, even if the iteration count is lowered, the transmission power of the base station is not increased to a value equal to or more than the required value, and it is hence possible to prevent increase in the interference in other users.

Another Exemplary Embodiment

Description will next be given of an embodiment as another exemplary embodiment of the present invention in which although the basic configuration is similar, processing steps to judge reliability of the result of the TF A quality measurement are added to the flowchart of operation of the transmission power control of TF Bi shown in FIG. 6.

FIG. 8 is a diagram showing a flowchart of operation of the transmission power control of TF Bi to judge reliability of the result of the TF A quality measurement.

In the exemplary embodiment, the outer loop power control and iteration control section 11 first makes a check to determine whether or not the quality of TF A has been updated within the T1 period of time in the past (step 5-1). Here, T1 is a value beforehand set to the mobile communication terminal and is determined by a field evaluation or the like of a radio environment or the like of a predetermined region.

If the quality of TF A has been updated within the T1 period of time in the past, a check is made as in FIG. 6 to determine whether or not the quality of TF A is equivalent to the required quality according to the measurement result of the BLER measuring section A (step 5-4). If this is not the case, it is likely that the radio environment has changed due to movement of the terminal and a state of uses of other users. Therefore, it is determined that reliability of the quality of measurement by TF A has lowered, and a check is made to determine whether or not the quality of TF A has been updated within the T2 period of time in the past (step 5-2). Here, T2 is a value beforehand set to the mobile communication terminal and is set to meet the condition of expression (3) below:

$$T1 < T2 \quad (3)$$

In step 5-2, if the quality of TF A has been updated within the T2 period of time in the past, control goes to (step 5-5). If this is not the case, it is determined that the transmission reliability of TF A is low; and the iteration count of TF Bi is reset to the maximum value (initial value; step 5-3), the reception characteristic at reception of TF Bi is raised, and then control goes to (step 5-5).

Subsequent processing is similar to that shown in FIG. 6. That is, in step 5-4, if the TF A quality is equivalent to the required quality, specifically, if the above condition (expression (2)) is satisfied, that is, if it is determined that the outer loop power control for TF A has converged, the iteration control processing shown in FIG. 7 is executed (step 5-8) and control goes to (step 5-9) after the processing of step 5-8.

Additionally, if the TF A quality is not equivalent to the required quality in step 5-4, a check is made to determine whether or not the TF Bi quality is more than the required quality (step 5-5).

In step 5-5, if the TF Bi quality is more excessive than the required quality, that is, BLER is less than BLER beforehand set as the required quality, a value obtained by lowering the target SIR by XdB is set to the TPC bit generating section 12 (step 5-6). When the setting is carried out, the transmission power of the base station decreases by XdB due to the inner loop transmission power control described above, and hence the excessive quality can be lowered. Thereafter, control goes to (step 5-9).

In step 5-5, if the TF Bi quality is below the required quality, a value obtained by increasing the target SIR by XdB is set to the TPC bit generating section 12 (step 5-7). When the setting is carried out, the transmission power of the base station increases by XdB due to the inner loop transmission power control described above, and hence the insufficient quality can be increased. Thereafter, control goes to (step 5-9).

In step 5-9 of the above processing, the value of TF B counted as above (expression (1)) is reset (i.e., the CRC OK/NG count value is reset to zero) and then the BLER measurement is started for the next period.

The XdB is a value beforehand set to the mobile communication terminal like in FIG. 5. Additionally, for the exemplary embodiment, a method of simply comparing the reception quality with the required quality has been described also for simplification. To prevent fluctuation due to measuring errors and environmental changes, there may be employed a method of conducting control to keep the target SIR unchanged if the difference between the reception quality and the required quality is within a preset value.

As above, in the exemplary embodiment, the iteration control is not conducted when the reception quality is low for the measured TF A, and hence there is obtained an advantage to prevent the deterioration in performance due to an erroneous operation in the iteration control processing.

BRIEF DESCRIPTION OF DRAWINGS

FIG. 1 is a diagram showing a turbo decoding system and a transmission power control method of a conventional CDMA mobile communication terminal.

FIG. 2 is an image diagram showing an example of a relationship between TFCI and the number of bits before turbo encoding.

Figure 3:
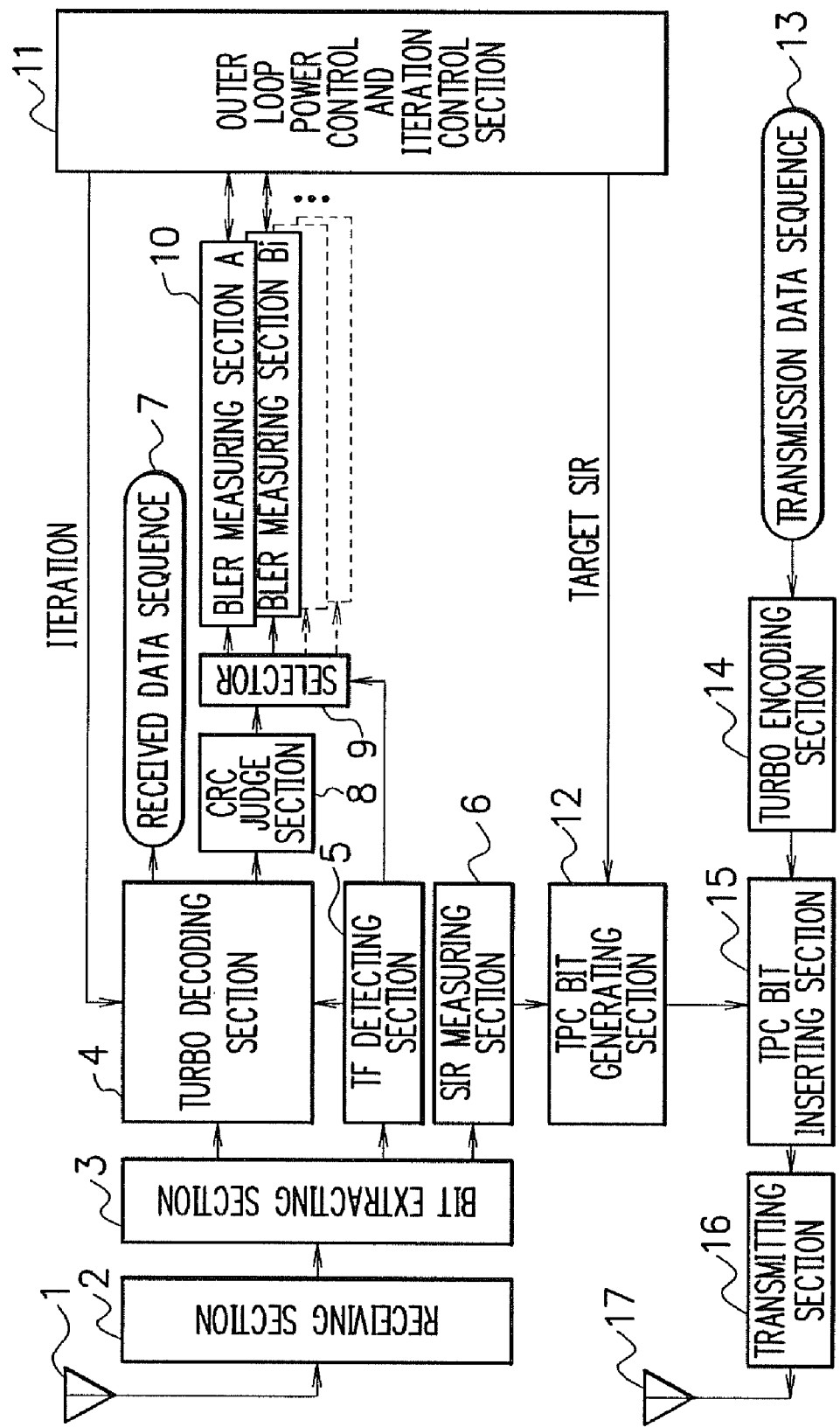
FIG. 3 is a block diagram showing a configuration of a CDMA mobile communication terminal as an exemplary embodiment of the present invention.
Figure 4:
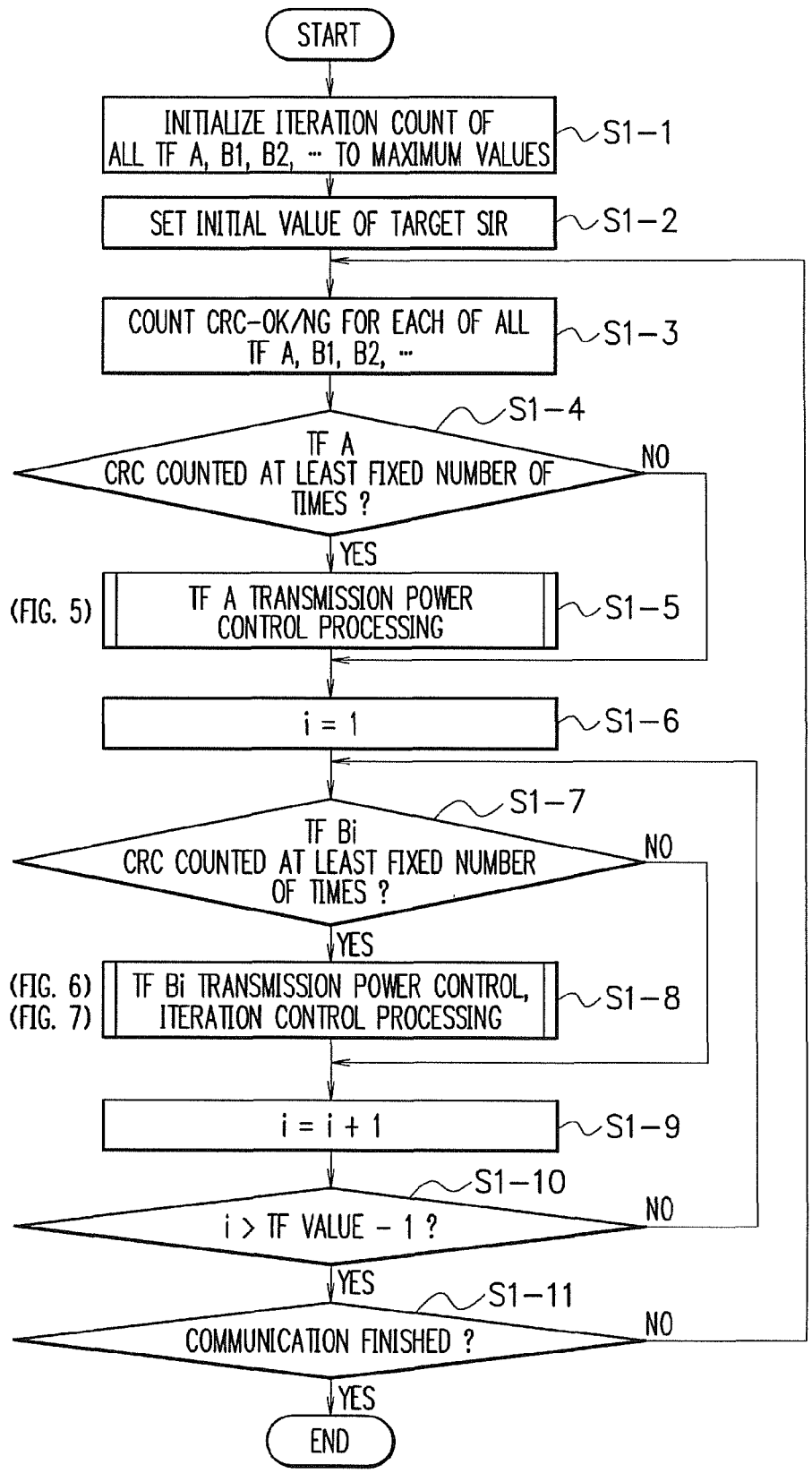
FIG. 4 is a diagram showing a flowchart of an overall operation of the exemplary embodiment.
Figure 5:
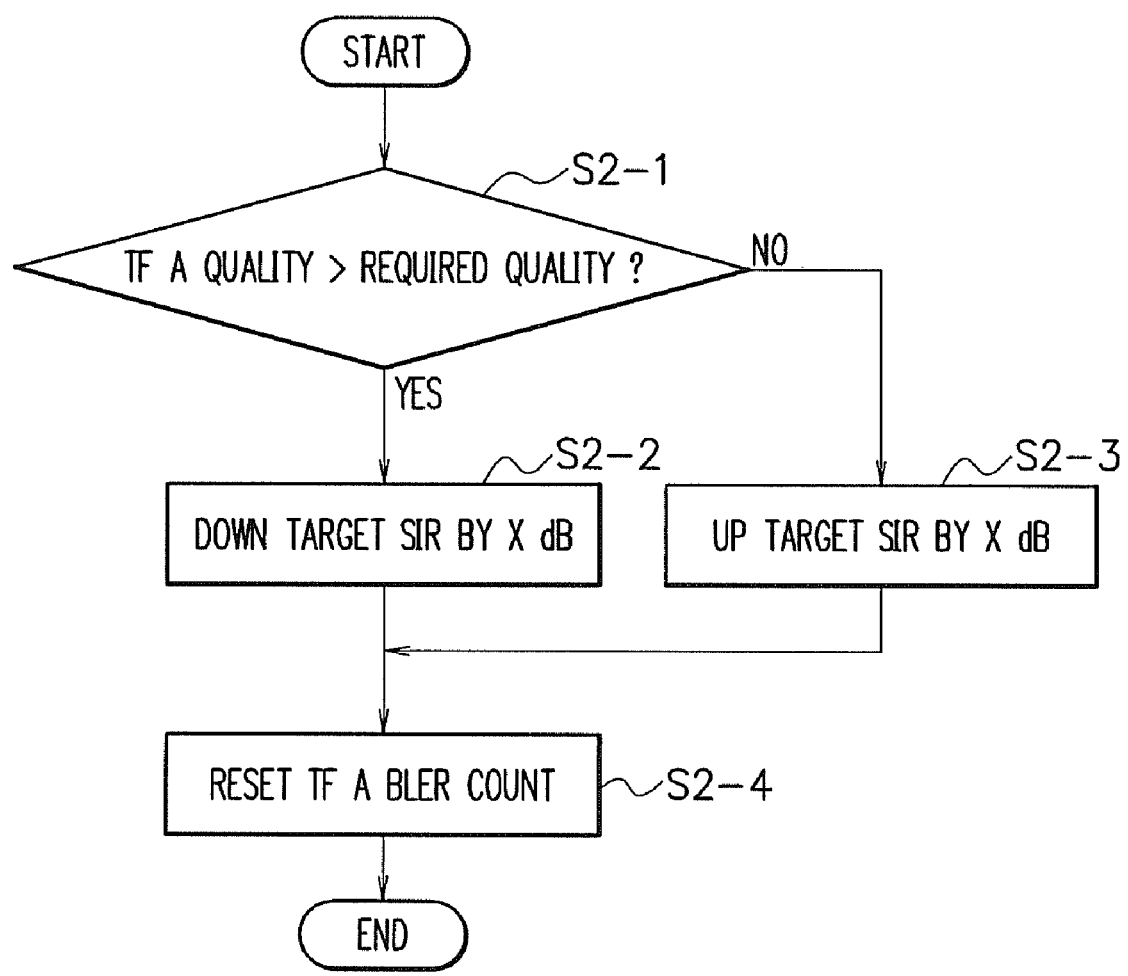
FIG. 5 is a diagram showing a flowchart of transmission power control processing of TF A in step 1-5 of FIG. 4.
Figure 6:
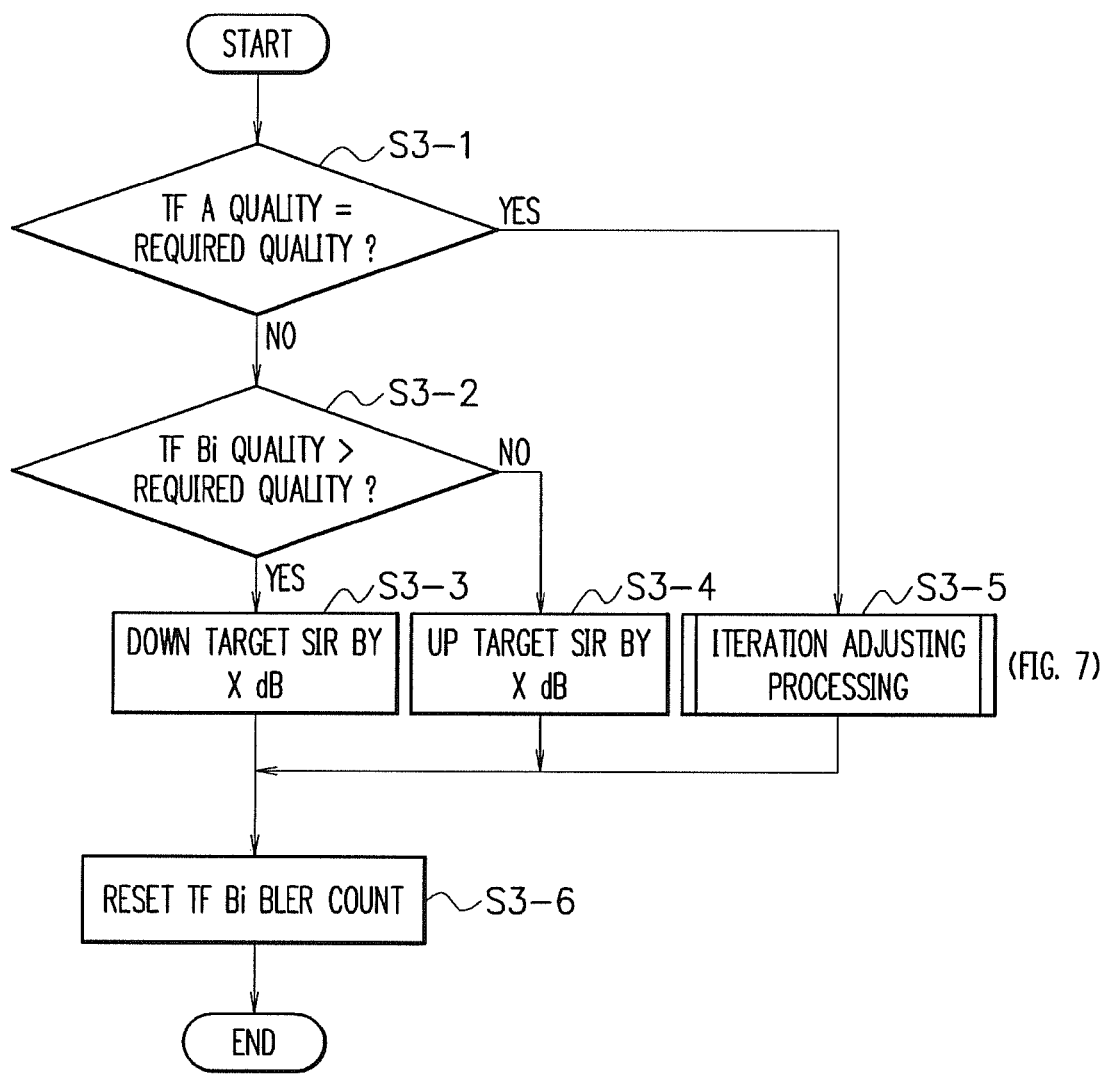
FIG. 6 is a diagram showing a flowchart of transmission power control and iteration control processing of TF Bi in step 1-8 of FIG. 4.
Figure 7:
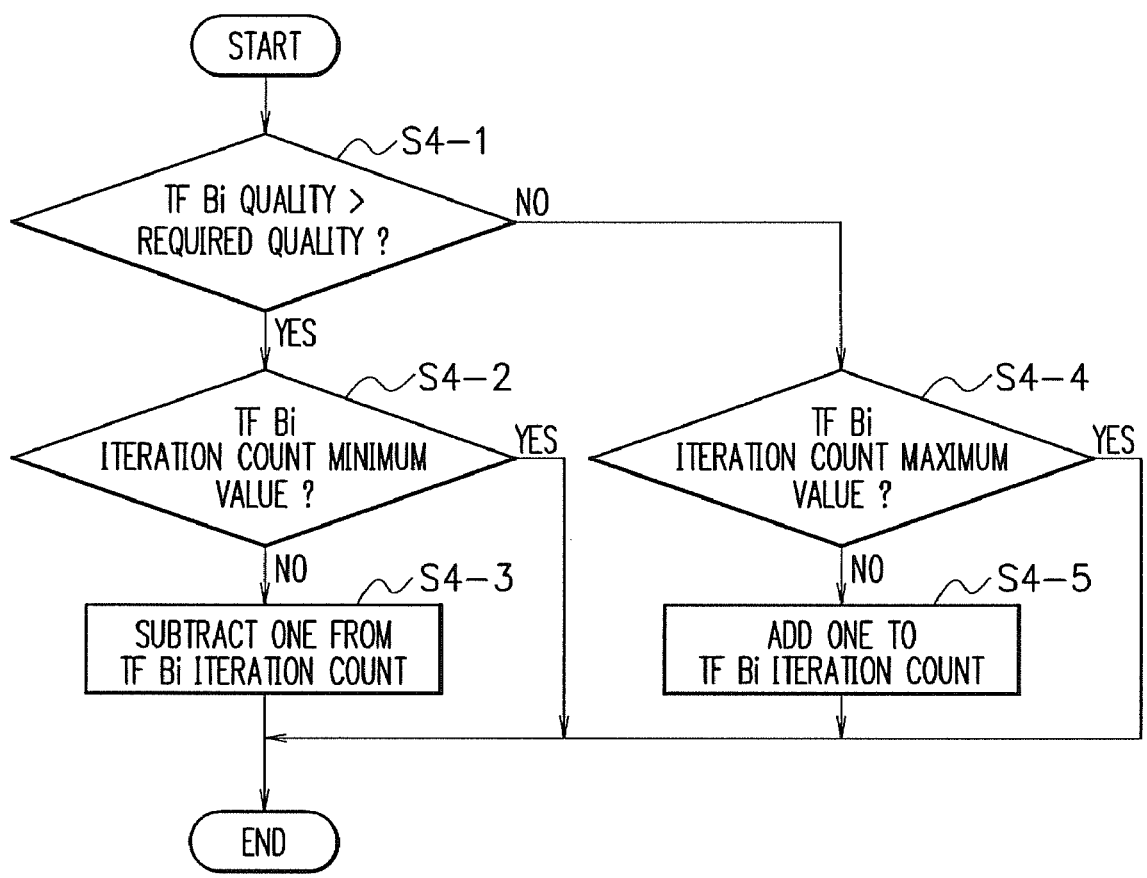
FIG. 7 is a diagram showing a flowchart of iteration control processing in step 3-5 of FIG. 6.
Figure 8:
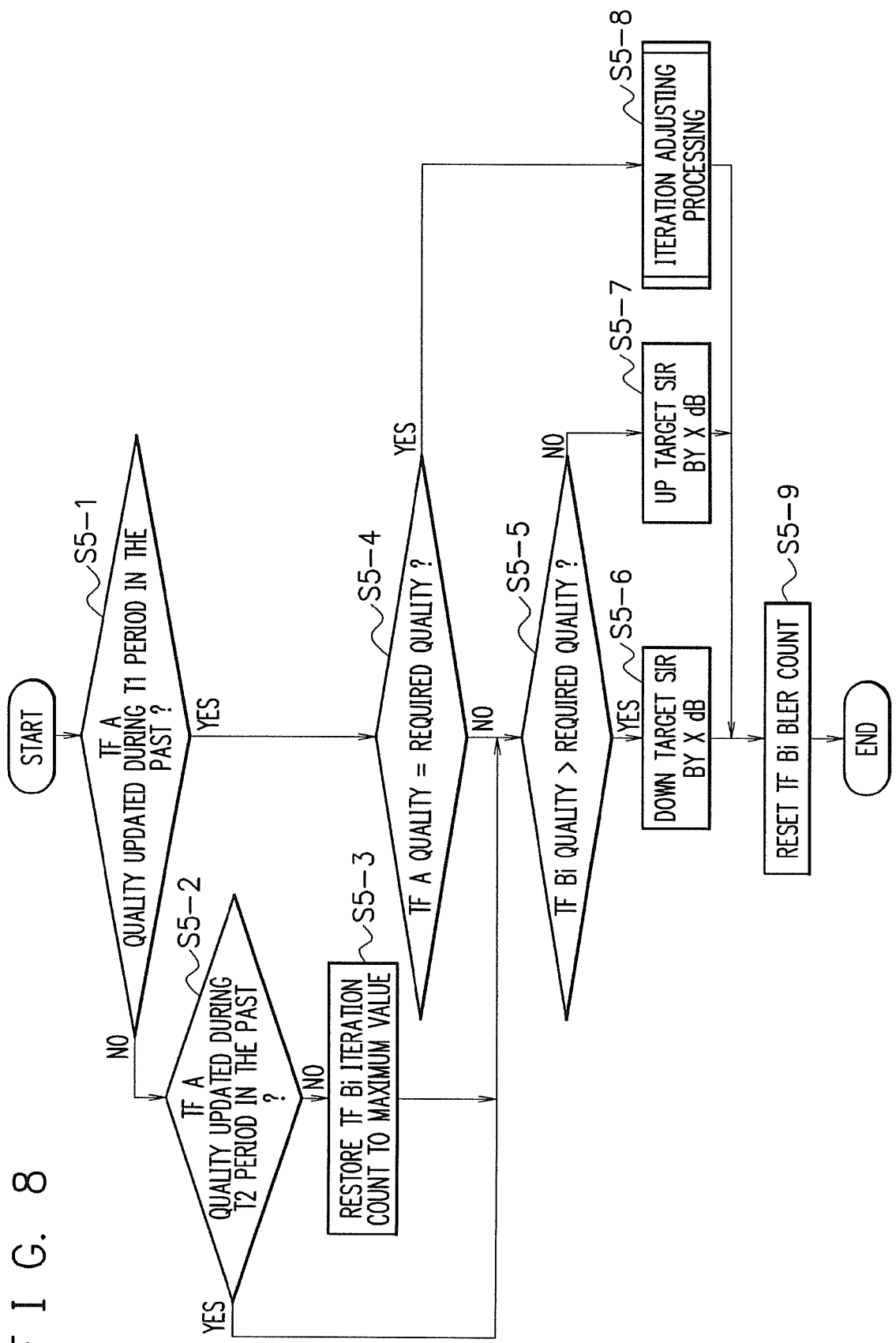
FIG. 8 is a diagram showing a flowchart of transmission power control operation of TF Bi to judge reliability of TF A quality measurement result.

DESCRIPTION OF REFERENCE NUMERALS 1, 17, 21, 36 Antenna
2, 22 Receiving section
3, 23 Bit extracting section
4, 24 Turbo decoding section
5, 25 TF detecting section
6, 26 SIR measuring section
7, 27 Reception data sequence
8, 28 CRC judge section
9 Selector
10 BLER measuring section (A, B1, B2, B3, ... )
11 Outer loop power control and iteration control section
12, 31 TPC bit generating section
14, 32 Transmission data sequence
15, 34 TPC bit inserting section
16, 35 Transmitting section
29 BLER measuring section
30 Outer loop power control section

What is claimed is:

1. A turbo decoding system of a Code Division Multiple Access (CDMA) mobile communication terminal to control transmission power of a base station based on reception quality of a reception signal measured according to a Cyclic Redundancy Check (CRC) judge result after an error correction by turbo decoding, comprising:

a quality measuring unit which separately measures the reception quality for each of a number of decoding bits of the reception signal and a control section which controls for each of the number of decoding bits, based on the reception quality of a decoding bit count measured by the quality measuring unit, a transmission power control bit to control transmission power of the base station and to be inserted in a transmission signal and an iteration count of turbo decoding, wherein the control section controls the iteration count of turbo decoding if the reception quality of a given decoding bit of the number of decoding bits requiring highest reception performance satisfies a predetermined reception quality due to control of the transmission power control bit which is controlled based on the reception quality of the given decoding bit of the number of decoding bits requiring highest reception performance, wherein the control section controls, if the reception quality of the given decoding bit of the number of decoding bits requiring highest reception performance does not satisfy the predetermined reception quality, the transmission power control bit is controlled based on the reception quality of each of the number of decoding bits other than the given decoding bit.

2. The turbo decoding system in accordance with claim 1, wherein the control section controls, if the reception quality of the given decoding bit of the number of decoding bits requiring highest reception performance has been updated within a past predetermined period of time and satisfies the predetermined reception quality, the iteration count of turbo decoding.

3. The turbo decoding system in accordance with claim 2, wherein the control section controls, if the reception quality of the given decoding bit of the number of decoding bits requiring highest reception performance has not been updated within the past predetermined period of time, the transmission power control bit based on the reception quality of each of the number of decoding bits other than the given decoding bit.

4. The turbo decoding system in accordance with claim 3, wherein the control section once sets, if the reception quality of the given decoding bit of the number of decoding bits requiring highest reception performance has been updated neither within the past predetermined period of time nor within a fixed period of time before the past predetermined period of time, the iteration count of turbo decoding to a maximum value.

5. The turbo decoding system in accordance with claim 1, wherein the control section performs, as control of the iteration count, control of the iteration count of turbo decoding such that the reception quality of each of the number of decoding bits other than the given decoding bit satisfies a predetermined required quality.

6. The turbo decoding system in accordance with claim 5, further comprising:

a Signal to Interference Ratio (SIR) measuring section that measures a signal-to-interference ratio using the reception signal for each of the number of decoding bits, a Transmission Power Control (TPC) bit generating section that generates the transmission power control bit such that an output from the SIR measuring section is a target signal-to-interference ratio, and a TPC bit inserting section that inserts the transmission power control bit in a transmission signal, wherein the control section outputs the target signal-to-interference ratio to the TPC bit generating section based on a block error rate measured as the reception quality for each of the number of decoding bits by the quality measuring section such that the block error rate when the reception quality of given decoding bit is a predetermined maximum value.

7. A transmission power control method of a Code Division Multiple Access (CDMA) mobile communication terminal to control transmission power of a base station based on reception quality of a reception signal measured according to a Cyclic Redundancy Check (CRC) judge result after an error correction by turbo decoding, comprising:
separately measuring the reception quality for each of a number of decoding bits and controlling for each of the number of decoding bits, based on measured reception quality of a decoding bit count, a transmission power control bit to control transmission power of the base station and to be inserted in a transmission signal and an iteration count of turbo decoding,
wherein if the reception quality of a given decoding bit of the number of decoding bits requiring highest reception performance satisfies a predetermined reception quality due to control of the transmission power control bit, the iteration count of turbo decoding is controlled based on the reception quality of the given decoding bit of the number of decoding bits requiring highest reception performance,
wherein if the reception quality of the given decoding bit of the number of decoding bits requiring highest reception performance does not satisfy the predetermined reception quality, the transmission power control bit is controlled based on the reception quality of each of the number of decoding bits other than the given decoding bit.

8. The transmission power control method in accordance with claim 7, wherein if the reception quality of given decoding bit of the number of decoding bits requiring highest reception performance has been updated within a past predetermined period of time and satisfies the predetermined reception quality, the iteration count of turbo decoding is controlled.

9. The transmission power control method in accordance with claim 8, wherein if the reception quality of the given decoding bit of the number of decoding bits requiring highest reception performance has not been updated within the past predetermined period of time, the transmission power control bit is controlled based on the reception quality of each of the number of decoding bits other than the given decoding bit.

10. The transmission power control method in accordance with claim 9, wherein if the reception quality of the given decoding bit of the number of decoding bits requiring highest reception performance has been updated neither within the past predetermined period of time nor within a fixed period of time before the past predetermined period of time, the iteration count of turbo decoding is set to a maximum value.

11. The transmission power control method in accordance with claim 7, wherein as control of the iteration count, control of the iteration count of turbo decoding is performed such that the reception quality of each of the number of decoding bits other than the given decoding bit satisfies a predetermined required quality.

12. The transmission power control method in accordance with claim 11, wherein a signal-to-interference ratio using the reception signal for each of the number of decoding bits is measured, the transmission power control bit is generated such that the measured signal-to-interference ratio is a target signal-to-interference ratio, the transmission power control bit is inserted in a transmission signal, and the target signal-to-interference ratio is produced based on a block error rate measured as the reception quality for each of the number of decoding bits such that the block error rate when the reception quality of the given decoding bit is a predetermined maximum value.

13. A Code Division Multiple Access (CDMA) mobile communication terminal to control transmission power of a base station based on reception quality of a reception signal measured according to a Cyclic Redundancy Check (CRC) judge result after an error correction by turbo decoding, comprising:
a quality measuring unit which separately measures the reception quality for each of a number of decoding bits of the reception signal and a control section which controls for each of the number of decoding bits, based on the reception quality of a decoding bit count measured by the quality measuring unit, a transmission power control bit to control transmission power of the base station and to be inserted in a transmission signal and an iteration count of turbo decoding,
wherein the control section controls the iteration count of turbo decoding if the reception quality of a given decoding bit of the number of decoding bits requiring highest reception performance satisfies a predetermined reception quality due to control of the transmission power control bit which is controlled based on the reception quality of the given decoding bit of the number of decoding bits requiring highest reception performance,
wherein the control section controls, if the reception quality of the given decoding bit of the number of decoding bits requiring highest reception performance does not satisfy the predetermined reception quality, the transmission power control bit is controlled based on the reception quality of each of the number of decoding bits other than the given decoding bit.

14. The CDMA mobile communication terminal in accordance with claim 13, wherein the control section controls, if the reception quality of the given decoding bit of the number of decoding bits requiring highest reception performance has been updated within a past predetermined period of time and satisfies the predetermined reception quality, the iteration count of turbo decoding.

15. The CDMA mobile communication terminal in accordance with claim 14, wherein the control section controls, if the reception quality of the given decoding bit of the number of decoding bits requiring highest reception performance has not been updated within the past predetermined period of time, the transmission power control bit based on the reception quality of each of the number of decoding bits other than the given decoding bit.

16. The CDMA mobile communication terminal in accordance with claim 15, wherein the control section once sets, if the reception quality of the given decoding bit of the number of decoding bits requiring highest reception performance has been updated neither within the past predetermined period of time nor within a fixed period of time before the past predetermined period of time, the iteration count of turbo decoding to a maximum value.

17. The CDMA mobile communication terminal in accordance with claim 13, wherein the control section performs, as control of the iteration count, control of the iteration count of turbo decoding such that the reception quality of each of the number of decoding bits other than the given decoding bit satisfies a predetermined required quality.

18. The CDMA mobile communication terminal in accordance with claim 17, further comprising:

a Signal to Interference Ratio (SIR) measuring section that measures a signal-to-interference ratio using the reception signal for each of the number of decoding bits,
a Transmission Power Control (TPC) bit generating section that generates the transmission power control bit such that an output from the SIR measuring section is a target signal-to-interference ratio,
and a TPC bit inserting section that inserts the transmission power control bit in a transmission signal,
wherein the control section outputs the target signal-to-interference ratio to the TPC bit generating section based on a block error rate measured as the reception quality for each of the number of decoding bits by the quality measuring section such that the block error rate when the reception quality of given decoding bit is a predetermined maximum value.

* * * * *